(12) United States Patent
Karlsson et al.

(10) Patent No.: US 9,148,067 B2
(45) Date of Patent: Sep. 29, 2015

(54) SWITCHED POWER CONVERTER

(71) Applicant: KOLLMORGEN AB, Stockholm (SE)

(72) Inventors: Ulf Bengt Ingemar Karlsson, Bagarmossen (SE); Christer Ohlin, Varmdo (SE)

(73) Assignee: KOLLMORGEN AB, Stockholm (SE)

( * ) Notice: Subject to any disclaimer, the term of this patent is extended or adjusted under 35 U.S.C. 154(b) by 351 days.

(21) Appl. No.: 13/850,051

(22) Filed: Mar. 25, 2013

(65) Prior Publication Data

US 2013/0308362 A1    Nov. 21, 2013

(30) Foreign Application Priority Data

Apr. 4, 2012 (EP) .................................... 12163128

(51) Int. Cl.
*H05K 7/20* (2006.01)
*H02M 7/00* (2006.01)

(52) U.S. Cl.
CPC ............... *H02M 7/003* (2013.01); *H05K 7/209* (2013.01)

(58) Field of Classification Search
CPC ............................... H02M 7/003; H05K 7/209
USPC ..................................................... 363/141, 147
See application file for complete search history.

(56) References Cited

U.S. PATENT DOCUMENTS

| | | | |
|---|---|---|---|
| 6,465,728 B1 * | 10/2002 | McLaughlin et al. | 174/16.3 |
| 2004/0232538 A1 * | 11/2004 | Linke | 257/686 |
| 2006/0061969 A1 * | 3/2006 | Nilson et al. | 361/704 |
| 2007/0133180 A1 * | 6/2007 | Nilson et al. | 361/720 |

* cited by examiner

*Primary Examiner* — Jue Zhang
(74) *Attorney, Agent, or Firm* — Park, Vaughan, Fleming & Dowler LLP

(57) ABSTRACT

The present invention relates to a switched power converter including a base plate on which at least one heat sink is arranged. The converter further includes at least one power transistor arranged on a side of the at least one heat sink. Further, at least one spring element is arranged to press against the power transistor arranged on a side of the at least one heat sink and an oppositely facing side of either an adjacent heat sink or a base plate end face parallel to the at least one heat sink.

15 Claims, 5 Drawing Sheets

SWITCHED POWER CONVERTER

RELATED APPLICATION

This application claims priority to European Patent Application No. 12163128.7, filed on 4 Apr. 2012, the contents of which are herein incorporated by reference in their entirety for all purposes.

TECHNICAL FIELD

The invention relates to a switched power converter comprising a base plate on which at least one heat sink is arranged, the converter device further comprising at least one power transistor arranged on a side of the at least one heat sink.

BACKGROUND

When designing switched power converters, and in particular high voltage DC/AC converters or inverters, thermal management is of utmost importance. Since a considerable amount of energy is dissipated in the components of the converter, with a resulting heat emission, thermal dissipation must be arranged for.

In prior art high voltage switching converters, a base plate is provided on which a plurality of elongated heat sinks are arranged parallel to each other. On both sides of each heat sink, power transistors are arranged for switching a high DC voltage. The power transistors are mounted to a printed circuit board (PCB) which is placed on top of the heat sinks with the transistors facing the base plate. Between each power transistor and its corresponding heat sink, a ceramic substrate is arranged for insulting purposes. Typically, grease is applied on both sides of the ceramic substrate to facilitate better thermal contact. Further, the power transistors must be assembled onto the board such that they are carefully fitted with the heat sink and the ceramic substrate; it is important that the transistors are in close contact with the heat sink and the intermediate substrate in order to attain a low thermal resistance and thus god thermal management. It is generally of great significance for switched power converters that heat is carried off from the power transistors.

However, in the above described prior art converter, it is difficult to assemble the transistors such that they on the one hand all press against their respective heat sink with sufficient force and on the other hand that wedging of the transistors between the heat sinks is facilitated without an installer having to apply excessive force when the board is placed on top of the heat sink.

SUMMARY

An object of the present invention is thus to provide a switched power converter which solves or at least mitigates these problems in the art.

This object is achieved in an aspect of the present invention by a switched power converter comprising a base plate on which at least one heat sink is arranged. The converter further comprises at least one power transistor arranged on a side of the at least one heat sink. Further, at least one spring element is arranged to press against the power transistor arranged on a side of the at least one heat sink and an oppositely facing side of either an adjacent heat sink or a base plate end face parallel to the at least one heat sink.

This is highly advantageous in that a force is applied on the power transistor by the spring element. This will press the power transistor against the heat sink on whose side the transistor is arranged. Thermal contact is thus established between the power transistor and the heat sink, and heat dissipation from the transistor via the heat sink is greatly facilitated. Further, the spring elements are a cost-effective way of attaining a high compressive force on the power transistors. The spring elements are relatively small and do not require much base material, such as steel or plastic, for production.

In an embodiment of the present invention, the spring element is arranged to press against the power transistor arranged on a side of the at least one heat sink and a further power transistor arranged on an oppositely facing side of the adjacent heat sink. This is advantageous, since a single spring element wedged between two adjacent heat sinks applies a pressing force onto at least two oppositely arranged power transistors.

In an embodiment of the present invention, the base plate of the switched power converter comprises a plurality of elongated heat sinks arranged parallel to each other and which base plate further has two end faces at a respective end of the base plate extending parallel to the elongated heat sinks. Further, the converter device comprises power transistors arranged on both sides of each heat sink, and a plurality of spring elements, each being arranged to press against a first power transistor arranged on one side of the respective heat sink and a second power transistor arranged on the oppositely facing side of the adjacent heat sink when being arranged between two adjacent heat sinks, and being arranged to press against a base plate end face and a third power transistor arranged on the oppositely facing side of the adjacent heat sink when arranged between a base plate end face and a heat sink, said spring elements thereby applying a force to the power transistors for pressing the transistors against the heat sinks. Further advantageous is that a high pressing force is applied with the spring element arrangement of the present invention. Thus, the power converter comprises a number of elongated heat sinks with power transistors arranged on both sides along the length of the respective heat sink. In case a spring element is arranged between two heat sinks, it is arranged such that it applies a pressure to two opposing power transistors on a respective heat sink. Thus, a single spring element will advantageously apply a force onto two power transistors thereby pressing the two power transistors against its respective heat sink, which further facilitates cost-effectiveness. In case a spring element is arranged between a heat sink and a base plate end face, it presses against a power transistor arranged on a side of a heat sink and the oppositely located end face, thus pressing the power transistor against the heat sink.

In an embodiment of the present invention, the spring element is U-shaped when compressed, wherein the two ends of the spring element apply a force in a respective opposite direction. Thus, when a spring element is introduced between two heat sinks and set in its compressed state, its two ends will contact a respective power transistor arranged on two adjacent heat sinks. In an alternative embodiment of the present invention, the spring element is V-shaped when compressed. Other appropriate shapes of the spring element can further be envisaged within the scope of the present invention.

In a further embodiment of the present invention, the switched power converter comprises a printed circuit board on which the power transistors are mounted. The power transistors are mounted to the board in a standing fashion, such that they extend vertically from the board. The printed circuit board is arranged on top of the heat sinks with the transistors facing the base plate. Further, the printed circuit board is arranged with a plurality of housings, each arranged to house a respective spring element. Alternatively, the housings are appropriately positioned on the base plate before the board is placed on top of the heat sinks. The housings generally comes in two forms; in case the housing is to be inserted between two heat sinks, it is shaped to fit between two opposite transistors, whereas in case the housing is to be inserted between a heat sink and an end face, it is shaped to fit between a transistor and a base plate end face. This is advantageous for several reasons: firstly, the transistors can be mounted to the heat sinks and the base plate from above, which greatly facilitates production. Secondly, since the board is arranged on top of the heat sinks from above, possible end faces of the base plate can be in place during mounting of the transistors to the heat sinks, since there is no need to access the heat sinks, the transistors and the spring elements from the side of the base plate. Thus, all four end faces can be in place during mounting from the above, which is highly advantageous. Thirdly, since each spring element is arranged in a housing, it will stay in place during mounting of the board to the heat sinks. Fourth, the housings, which are mounted on the board adjacent to the power transistors, will act as support for the transistors when the transistors and housings are inserted between the heat sinks. Fifth, the housing will be part of the fixation of the power transistors while soldering the transistors to the printed circuit board (PCB) during production. Sixth, the housing itself will facilitate further insulation between the spring elements and the respective transistors.

In still a further embodiment of the present invention, each housing is arranged with one or more openings facing the board, and the board is arranged with a corresponding through-hole which at least partly overlaps the opening in the housing. Thus, when the board is mounted on top of the heat sinks and the power transistors, housings and spring elements are inserted between the heat sinks (and between the heat sinks and the base plate end face), the spring element can be accessed via the board through-hole to be set in a compressed state. This is highly advantageous from a mounting perspective; when the housings are in place between the heat sinks and face the base plate, a peg- or pin-like means (or even a finger, given the size of the openings) can be inserted in the board through-hole and into the housing to snap the spring element into its compressed state, where the ends of the spring element press against the power transistors via the housing.

In yet another embodiment of the present invention, each housing is arranged with a first recess in its interior for holding one end of the spring element, and a second recess arranged on an opposite side to the first recess. The second recess is arranged to receive the other end of the spring element when the spring element is snapped into the compressed state. Advantageously, the first recess holds the spring element in place in the housing in one of its ends when the printed circuit board assembly (PCBA), i.e. the board including the various components mounted to it, is mounted on top of the heat sinks. When the board is assembled on top of the heat sink, the pin-like means is inserted in the board trough-hole and into the opening of the housing, thereby pushing the spring element downwards towards the base plate. When the other end of the spring element has travelled downwards an appropriate distance along the interior side of the housing opposite, it will engage with the second recess arranged oppositely to the first recess and the spring element will thus snap into the compressed state.

In a further embodiment of the present invention, each housing is separated in two portions along a vertical section. Advantageously, this will facilitate pressing of the power transistors against the heat sink sides, as the force applied by the spring element to the respective section of the housing will press the respective section against two oppositely arranged power transistors. Thus, since the two housing sections are arranged to drift apart when the spring force is applied and press against the transistors, the force is consequently better utilized.

In yet another embodiment of the present invention, a flexible insulating sheet material is arranged between a heat sink and the transistors arranged along the sides of the heat sink. This is advantageous since the insulating material easily can be arranged on a heat sink before the PCBA is mounted on top of the heat sinks, even with possible end faces mounted to the base plate. Due to its flexible and sheet-like nature, the insulating material is placed over the heat sink and will naturally form to have a relatively tight fit around the heat sink. The thin, cloth-like insulating material will further facilitate low thermal resistance between the power transistors and the heat sink.

It is noted that the invention relates to all possible combinations of features recited in the claims. Further features of and advantages with, the present invention will become apparent when studying the appended claims and the following description. Those skilled in the art realize that different features of the present invention can be combined to create embodiments other than those described in the following.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown. This invention may, however, be embodied in many different forms and should not be construed as limited to the embodiments set forth herein; rather, these embodiments are provided by way of example so that this disclosure will be thorough and complete, and will fully convey the scope of the invention to those skilled in the art.

Figure 1:
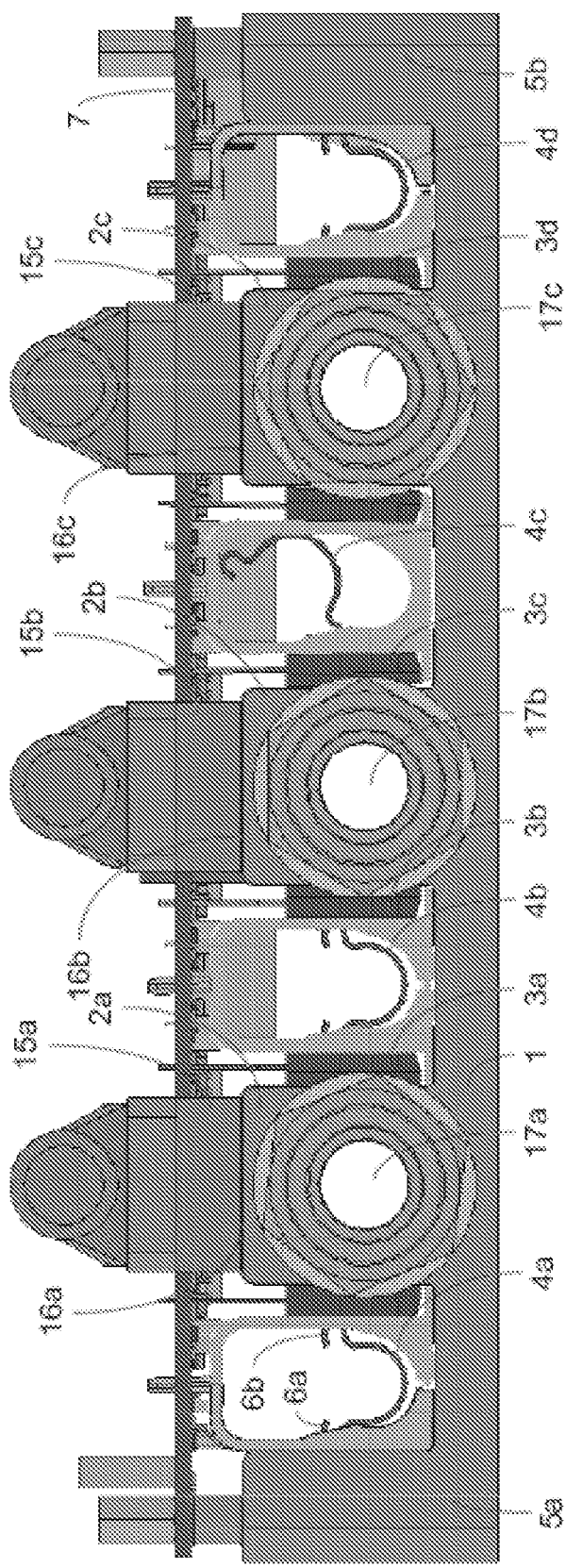
FIG. 1 shows a switched power converter according to an embodiment of the present invention.

FIG. 1 illustrates a power converter according to an embodiment of the present invention. The switched power converter comprises a base plate 1 on which a number of elongated heat sinks 2a, 2b, 2c are arranged parallel to each other. In this particular exemplifying embodiment, three heat sinks are used, but any number is possible; from one single heat sink and up. The base plate has two end faces 5a, 5b extending parallel to the heat sinks. Further, the power converter comprises power transistors 3b, 3c arranged on both sides of each heat sink 2b, even though it would be possible to place transistors only on one side of each heat sink. In practice, it is common to design a power converter that is capable of providing as much power as possible; thus, to attain a high power density, it is desirable to have as many power transistors as possible for a given physical volume and given power level. Most common configuration is a 3-phase DC/AC converter where each phase consists of two power switches connected in series between +DC and −DC and thereby forming a bridge leg. The mid point between the switches (bridge-leg output) is connected to each phase of the load. Each switch can consist of several paralleled power transistors with antiparallel diode function. Hence a three-phase converter will consist of totally six switches resulting in three heat sinks with power transistors mounted on both sides of the heat sinks. Further, in an embodiment of the present invention, to adapt the power converter to different loads, the power transistors are arranged along the length of each heat sink and may be coupled in parallel such that current of a particular magnitude is delivered to a load having particular current requirements. Hence, in case a power converter must be capable of delivering a greater current, the length of each heat sink is extended and further power transistors are added in the design phase. The power converter further comprises a plurality of spring elements 4a, 4b, 4c, 4d, where an individual spring element, such as spring elements 4b, 4c, is arranged to press against a first power transistor 3a arranged on one side of the respective heat sink 2a and a second power transistor 3b arranged on the oppositely facing side of the adjacent heat sink 2b, when being arranged between two heat sinks. Correspondingly, in the case of e.g. spring element 4d, when being arranged between a base plate end face 5b and a heat sink 2c, the spring element is arranged to press against the base plate end face and a third power transistor 3d arranged on the oppositely facing side of the adjacent heat sink. Advantageously, each spring element applies a force to the power transistors such that the transistors are pressed against the heat sinks, thus improving thermal contact between the power transistors and the heat sinks. In FIG. 1, for illustration purposes only, it should be noted that spring elements 4a, 4b and 4d are shown in compressed state, while spring element 4c is shown in uncompressed state. That is, in FIG. 1, spring element 4c is still to be set in its operating, compressed state.

As can be seen in FIG. 1, in an embodiment of the present invention, the spring elements 4a, 4b, 4c, 4d are U-shaped when compressed, wherein the two ends 6a, 6b of each spring element apply a force in opposite directions. Thus, when a spring element 4b is introduced between two heat sinks 2a, 2b and set in its compressed state, its two ends will apply a force onto a respective power transistor 3a, 3b arranged on the sides of the two heat sinks. As previously mentioned, the spring elements are in an alternative embodiment V-shaped when compressed.

With further reference to FIG. 1, in yet another embodiment of the present invention, a flexible insulating sheet material 16a, 16b, 16c is arranged between each heat sink 2a, 2b, 2c and the transistors arranged along the sides of the heat sink. This is advantageous since the insulating material easily can be arranged on a heat sink before board 7 is mounted on top of the heat sinks, even with possible end faces 5a, 5b mounted to the base plate 1. Even though it is not shown in FIG. 1, the final power converter will have two further end faces perpendicularly arranged to the two end faces 5a, 5b show in FIG. 1, thereby enabling encapsulation of the heat sinks. Due to its flexible and sheet-like nature, the insulating material is placed over the heat sink and will naturally form to have a relatively tight fit around the heat sink. The thin, cloth-like insulating material will further facilitate low thermal resistance between the power transistors and the heat sink. Alternatively, the flexible insulating sheet material 16a, 16b, 16c can be integrated into a single insulating sheet.

As is further illustrated in FIG. 1, in still another embodiment of the present invention, a current rail 15a, 15b, 15c will be arranged on each heat sink 2a, 2b, 2c. In this particular example, each current rail carries a respective phase current to be supplied to a converter three-phase load (not shown). Advantageously, the current rails are cooled by the same heat sinks employed for cooling the power transistors. As shown in FIG. 1, each heat sink is arranged with a channel 17a, 17b, 17c in its interior for housing a cooling medium, for example a mix of water and glycol. Alternatively, the heat sinks 2a, 2b, 2c are not arranged with a respective channel and the base plate 1 may in such case be arranged with one or more cooling fins (not shown) on its underside for improving heat transfer, onto which forced air cooling is applied for further improving heat sink cooling.

Figure 2:
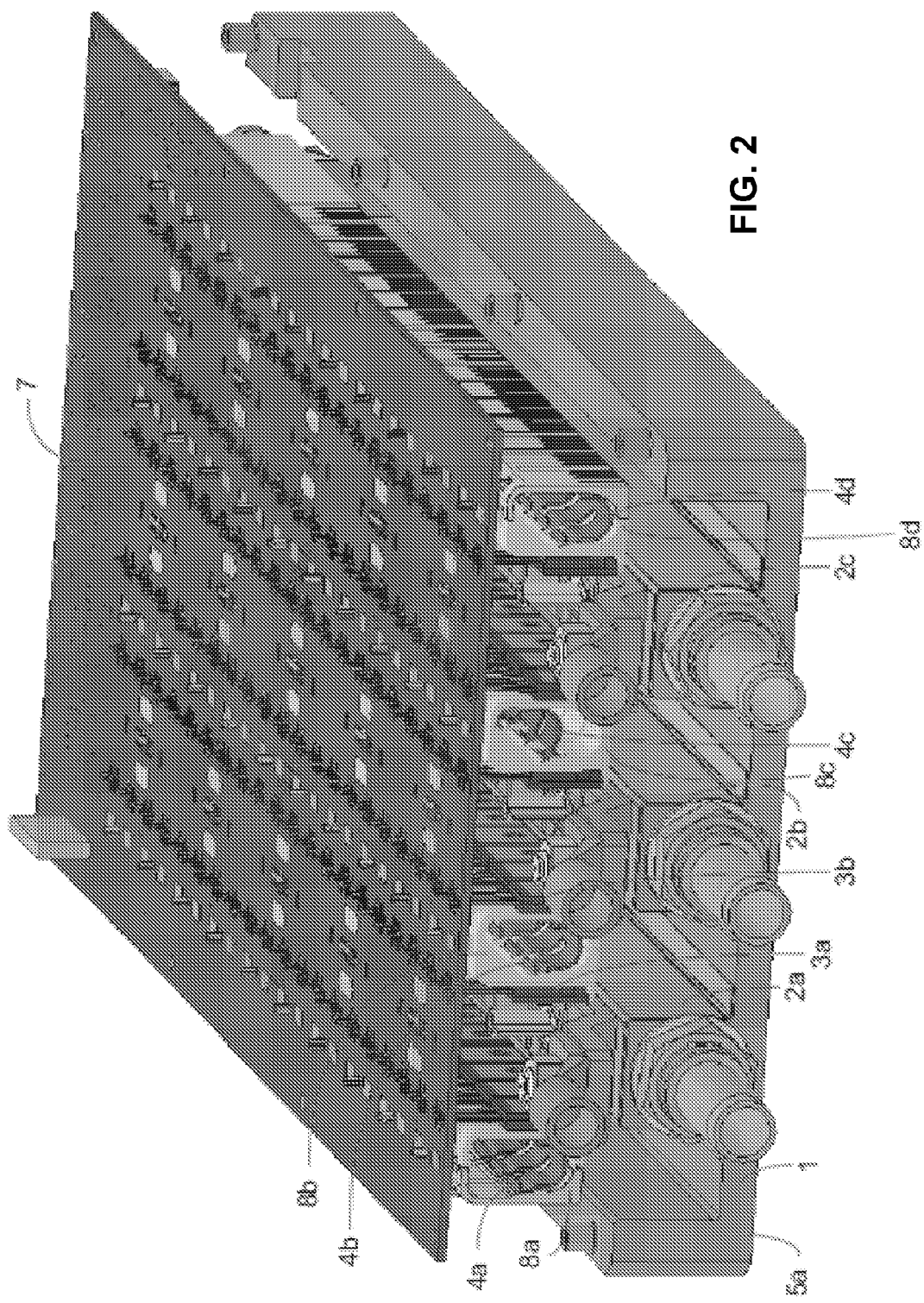
FIG. 2 shows a switched power converter according to another embodiment of the present invention, illustrating a printed circuit board to be mounted on top of power converter heat sinks.

FIG. 2 shows a different view of the switched power converter according to an embodiment of the present invention, where the printed circuit board 7 yet is to be mounted on top of the heat sinks 2a, 2b, 2c. The power transistors 3a, 3b are mounted to the board in a standing fashion, vertically or almost vertically extending from the board. The printed circuit board assembly (PCBA), i.e. the board 7 including the various components mounted to it, is arranged on top of the heat sinks with the transistors facing the base plate 1. Further, the printed circuit board is arranged with a plurality of housings 8a, 8b, 8c, 8d, each arranged to house a respective spring element 4a, 4b, 4c, 4d. Alternatively, the housings 8a, 8b, 8c, 8d are already appropriately positioned on the base plate 1 before the board 7 is placed on the heat sinks 2a, 2b, 2c. The housings generally comes in two forms; in case a housing is to be inserted between two heat sinks 2a, 2b it is shaped to fit between two opposite transistors 3a, 3b, whereas in case a housing is to be inserted between a heat sink 2a and an end face 5a, it is shaped to fit between a transistor and a base plate end face.

Figure 3:
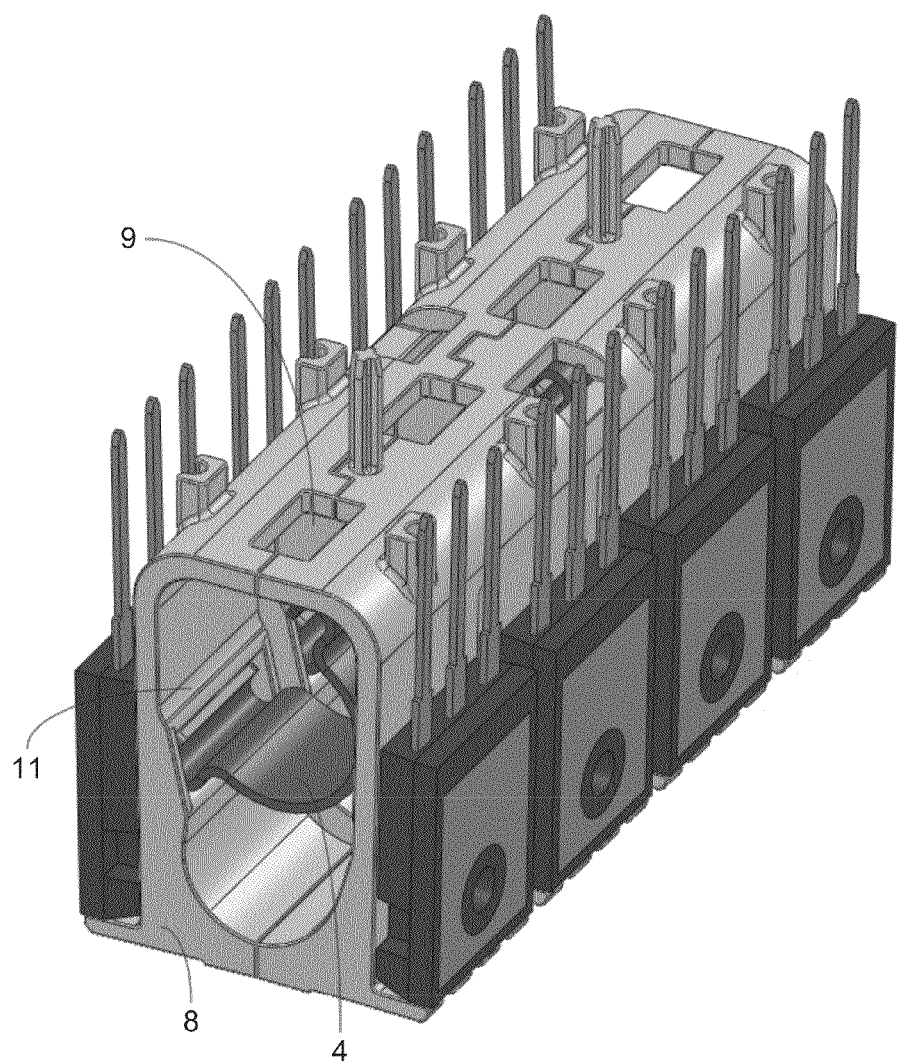
FIG. 3 shows a detailed view of a housing comprised in the power converter according to embodiments of the present invention.

FIG. 3 illustrates a housing and a corresponding spring element in further detail according to an embodiment of the present invention, where the housing 8 is arranged with an opening 9 facing the board.

Figure 4:
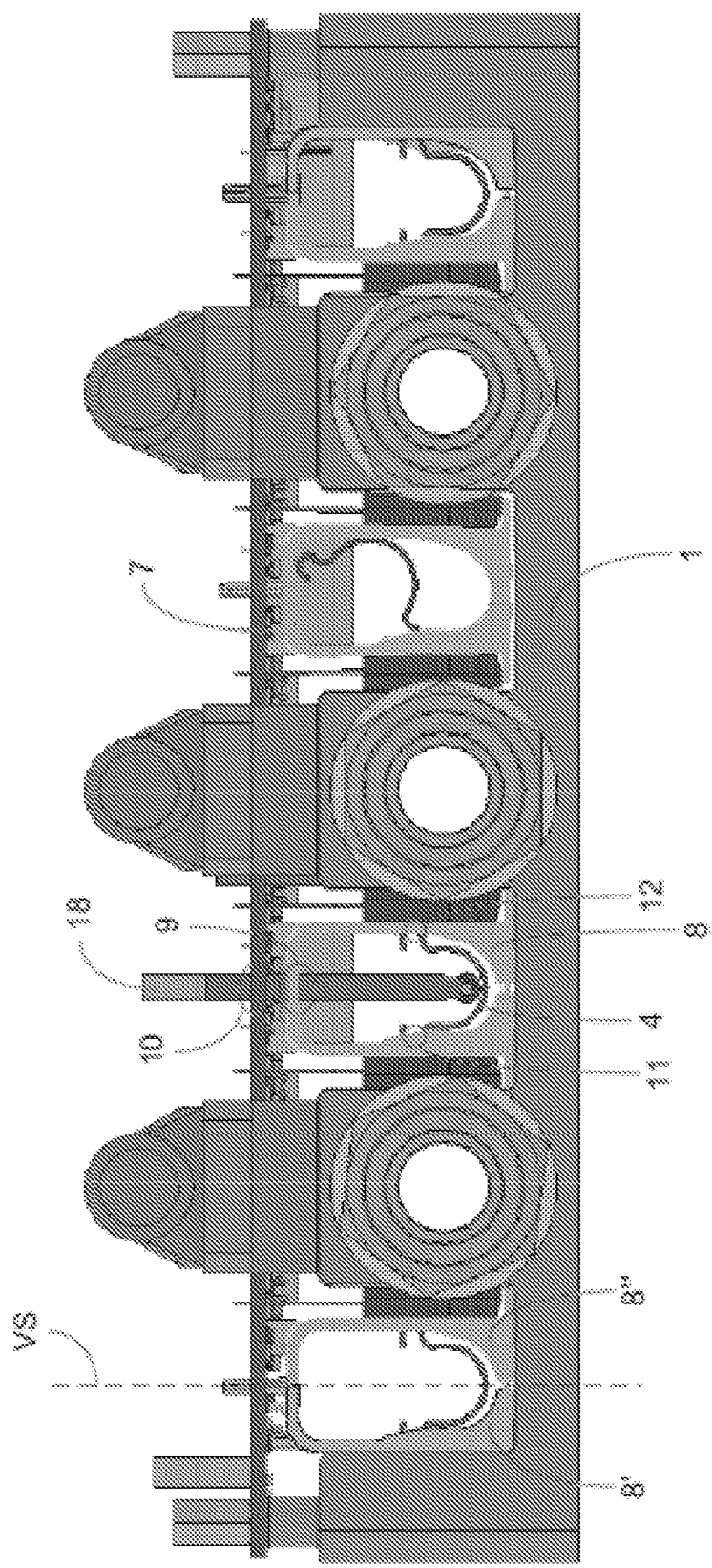
FIG. 4 shows snapping of a spring element into a compressed state according to a further embodiment of the present invention.

As shown in FIG. 4, the board 7 is arranged with a corresponding through-hole 10 which at least partly overlaps the opening in the housing 9. Thus, when the PCBA is mounted on top of the heat sinks 2a, 2b, 2c and the power transistors, housings and spring elements are inserted between the heat sinks (and between the heat sinks and the base plate end face), the spring element can be accessed via the board through-hole to be set in a compressed state. This is highly advantageous from a mounting perspective; when the housings are in place between the heat sinks and face the base plate, a peg- or pin-like means 18 (or even a finger, given the size of the openings) can be inserted in the board through-hole 10 and into the housing 8 to snap the spring element 4 into its compressed state, where the ends 6a, 6b (shown in FIG. 1) of the spring element press against the power transistors via the housing.

With further reference to FIGS. 3 and 4, in yet another embodiment of the present invention, each housing 8 is arranged with a first recess 11 in its interior for holding one end 6a (see FIG. 1) of the spring element 4, and a second recess 12 arranged on an opposite side to the first recess. The second recess is arranged to receive the other end 6b of the spring element when the spring element is snapped into the compressed state. Advantageously, the first recess holds the spring element in place in the housing in one of its ends when the printed circuit board assembly is mounted on top of the heat sinks. When the board is assembled on top of the heat sink, the pin-like means 18 is inserted in the board trough-hole and into the opening 9 of the housing, thereby pushing the spring element downwards towards the base plate 1. During this movement downwards the spring element is gradually compressed and thereby a pressing force is applied to power transistors via the housings. When the other end of the spring element has travelled downwards an appropriate distance along the interior side of the housing opposite, it will engage with the second recess arranged oppositely to the first recess and the spring element will thus snap into the compressed state.

FIG. 4 illustrates a further embodiment of the present invention, where each housing 8 is separated in two portions 8', 8" along a vertical section VS. Advantageously, this will facilitate pressing of the power transistors against the heat sink sides, as the force applied by the spring element 4 to the respective portion 8', 8" of the housing will press the respective section against two oppositely arranged power transistors. Thus, since the two housing sections are arranged to drift apart when the spring force is applied and press against the transistors, the force is consequently better utilized.

Figure 5:
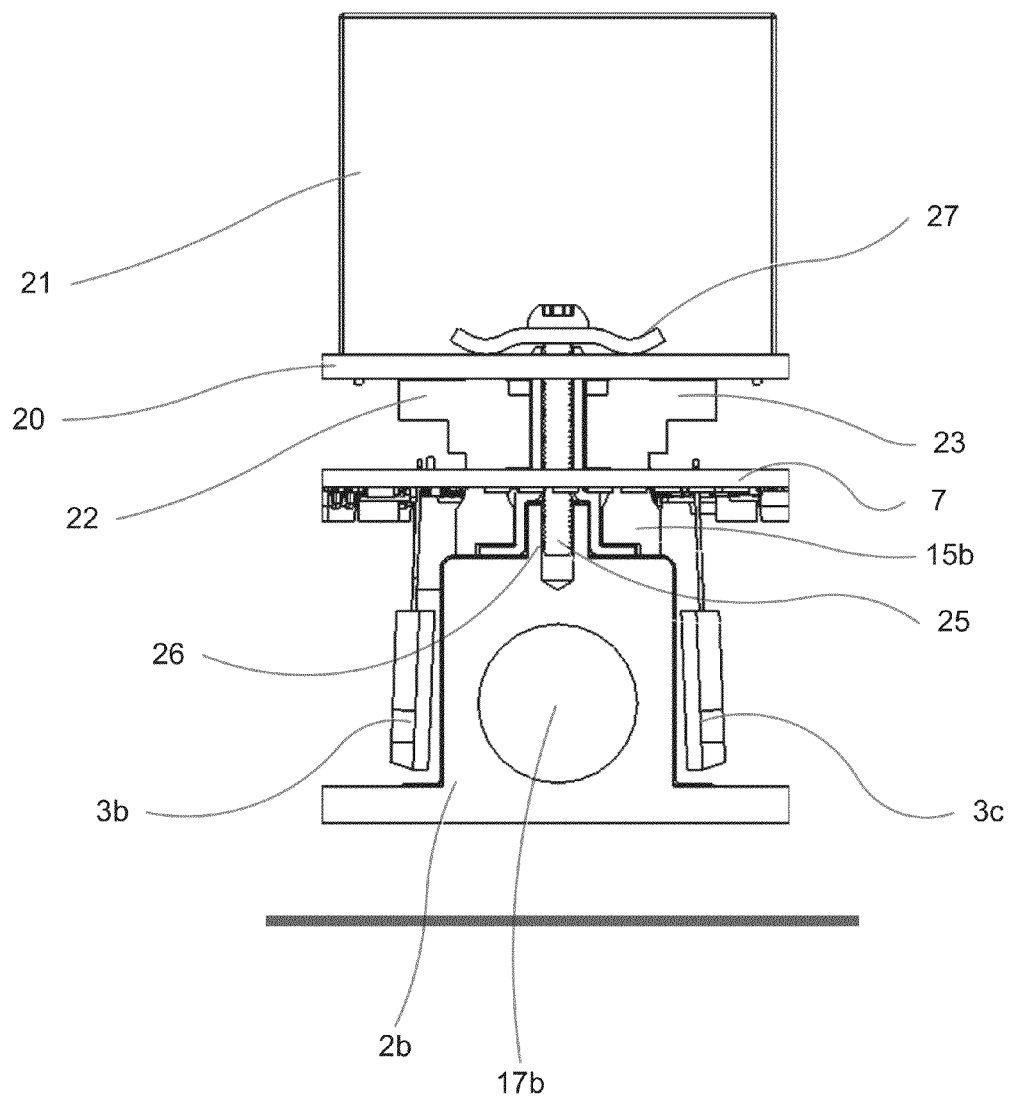
FIG. 5 illustrates a further embodiment of a switched power converter according to the present invention.

FIG. 5 illustrates a further embodiment of a switched power converter according to the present invention showing a second printed circuit board 20 on which power converter DC bus capacitors 21 are arranged. Typically, a number of DC bus capacitors are arranged on the second PCB along the length of each heat sink 2a, 2b, 2c (only heat sink 2b is shown in FIG. 5). Further, a DC+ bus bar 22 and a DC− bus bar 23 are arranged at each heat sink between the second printed circuit board 20 and the printed circuit board 7 on which the power transistors 3b, 3c are arranged. The respective DC bus bar 22, 23 extends along the length of the heat sink 2b. Further, as previously has been described, a current rail 15b, also known as an AC bus bar, is arranged between the printed circuit board 7 on which the power transistors are arranged and the heat sink 2b, and extends along the heat sink. Further electrical insulation may be provided between current rail 15b and heat sink 2b, for example by means of the previously discussed insulation sheet material 16b. Fastening means in the form of a screw or bolt 25 extends vertically from the second printed circuit board 20 to the heat sink 2b via the DC bus bars 22, 23, the printed circuit board 7 on which the power transistors 3b, 3c are arranged and the current rail 15b for applying a pressing force onto the second printed circuit board 20 against the heat sink 2b. As can be seen in FIG. 5, the screw 25 extends through the second PCB 20, the PCB 7 and the current rail 15b. However, the two DC bus bars 22, 23 extend on a respective side of the screw 25.

In order to achieve good electrical contact between the second PCB 20 and the DC bus bars 22, 23, the DC bus bars and the PCB 7, the PCB 7 and the current rail 15b, as well as to facilitate low thermal resistance from the DC bus capacitor 21, the second PCB 20, the DC bus bars 22, 23, the PCB 7 and the current rail 15b to heat sink 2b, a pressing force is applied by the screw 25. The screw 25 is arranged to engage in a threaded aperture 26 in the heat sink 2b at its one end and to engage in a spring 27 at its other end. This ensures a tight fit of the second PCB 20, the respective bus bars 22, 23, the PCB 7 and the current rail 15b to the heat sink 2b. This embodiment will, by means of the tight fitting of the various components to the heat sink 2b, further improve cooling of the various power converter components. Further, a single fastening means 25 is used to fixate the second PCB 20, the respective bus bars 22, 23, the PCB 7 and the current rail 15b to the heat sink 2b. A thermal contact is further established between the various components and the cooling medium contained in the heat sink channel 17b.

Even though the invention has been described with reference to specific exemplifying embodiments thereof, many different alterations, modifications and the like will become apparent for those skilled in the art. The described embodiments are therefore not intended to limit the scope of the invention, as defined by the appended claims.

What is claimed is:

1. Switched power converter comprising a base plate on which plurality of elongated heat sinks are arranged parallel to each other and which base plate further has an end face at a respective end of the base plate extending parallel to the elongated heat sinks, the power converter further comprising power transistors arranged on both sides of each heat sink, the converter further comprising:
   a plurality of spring elements, each being arranged to press against a first power transistor arranged on one side of the respective heat sink and a second power transistor arranged on the oppositely facing side of the adjacent heat sink when being arranged between two heat sinks, and being arranged to press against a base plate end face and a third power transistor arranged on the oppositely facing side of the adjacent heat sink when arranged between a base plate end face and a heat sink, said spring elements thereby applying a force to the power transistors for pressing the transistors against the heat sinks;
   the converter further comprising:
   a printed circuit board on which the power transistors are mounted, which printed circuit board is arranged on top of the heat sinks with the transistors facing the base plate, the converter further comprising a plurality of housings, each arranged to house the respective spring element, said housings being arranged to fit between the first and the second power transistors in case the housing is to be inserted between two heat sinks and being arranged to fit between the third power transistor and one of the base plate end faces in case the housing is to be inserted between a heat sink and an end face.

2. The switched power converter of claim 1, the at least one spring element being U-shaped when compressed, wherein the two ends of the spring element apply a force in a respective opposite direction.

3. The switched power converter of claim 1, the at least one spring element being V-shaped when compressed, wherein the two ends of the spring element apply a force in a respective opposite direction.

4. The switched power converter of claim 1, wherein each housing is arranged with one or more openings facing the board, the board further being arranged with at least one corresponding through-hole which at least partly overlaps said on or more openings in the housing, wherein the spring element is arranged to be accessed via the board through-hole to be snapped into a compressed state.

5. The switched power converter of claim 4, wherein each current rail carries a respective phase current arranged to be supplied to a converter three-phase load.

6. The switched power converter of claim 4, further comprising
   a second printed circuit board on which power converter DC bus capacitors are arranged;
   a DC+ bus bar and a DC− bus bar arranged at each heat sink between said second printed circuit board and the printed circuit board on which the power transistors are arranged; and fastening means extending vertically from the second printed circuit board to the heat sink via the DC bus bars, the printed circuit board on which the power transistors are arranged and the respective current rail for applying a pressing force acting vertically on the second printed circuit board, the DC+ bus bar, the DC− bus bar, the printed circuit board on which the power transistors are arranged, and the respective current rail, against the heat sink.

7. The switched power converter of claim 6, wherein said fastening means is a screw arranged to engage in a threaded aperture in the heat sink at its one end and to engage in a spring at its other end.

8. The switched power converter of claim 6, wherein the end faces are integrated in the base plate.

9. The switched power converter of claim 1, wherein each housing is arranged with a first recess in its interior for holding one end of the spring element, and a second recess arranged on an opposite side to the first recess, said second recess being arranged to receive the other end of the spring element when the spring element is snapped into the compressed state.

10. The switched power converter of claim 1, wherein each housing is arranged to be separated in two portions along a vertical section.

11. The switched power converter of claim 1, wherein a flexible insulating sheet material is arranged between each heat sink and the transistors arranged along the sides of the heat sink.

12. The switched power converter of claim 1, wherein current rails are arranged on the heat sinks between the insulating sheet material and the printed circuit board.

13. The switched power converter of claim 1, wherein each heat sink is arranged with a channel in its interior for housing a cooling medium.

14. The switched power converter of claim 1, wherein each heat sink is arranged to be solid and integrated in the base plate, said base plate further being arranged with one or more cooling fins on its underside.

15. The switched power converter of claim 1, wherein the power transistors are arranged along the length of each heat sink, and each switch of the power converter comprises a plurality of parallel-connected power transistors.

* * * * *